United States Patent [19]

Weber

[11] 4,379,996

[45] Apr. 12, 1983

[54] ENHANCEMENT OF CLASS C OPERATION OF BIPOLAR JUNCTION TRANSISTOR

[75] Inventor: Robert J. Weber, Marion, Iowa

[73] Assignee: Rockwell International Corporation, El Segundo, Calif.

[21] Appl. No.: 234,132

[22] Filed: Feb. 13, 1981

[51] Int. Cl.³ ............................................. H03F 1/00
[52] U.S. Cl. .................................... 330/296; 330/188
[58] Field of Search ...................... 330/286, 28 T, 296, 330/188–190

[56] References Cited

U.S. PATENT DOCUMENTS 4,322,689 3/1982 Schucht .............................. 330/286

Primary Examiner—James B. Mullins
Assistant Examiner—Gene Wan
Attorney, Agent, or Firm—Terry M. Blackwood; H. Fredrick Hamann

[57] ABSTRACT

Pulsed RF operation of a class C biased BJT is enhanced using a three element system to control the BJT emitter current. The three element system includes a transformer having a secondary connected in the emitter current path. Connected to the transformer primary are the other two elements, namely, an impedance and a pulse source. The three elements cooperate to cause the emitter current to substantially conform to a desired or predetermined pulse waveform.

15 Claims, 8 Drawing Figures

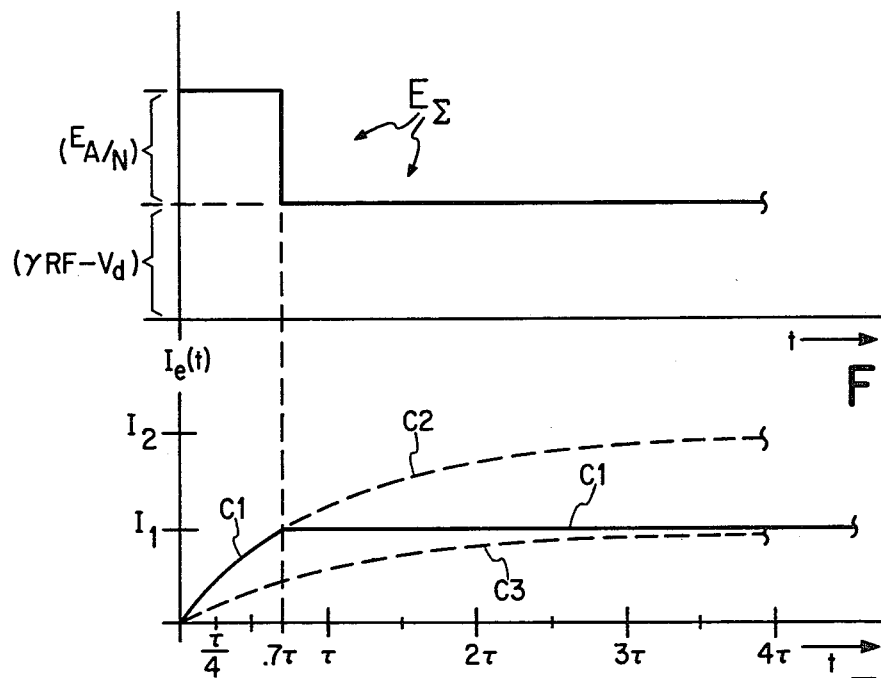
FIG. 5a
FIG. 5b
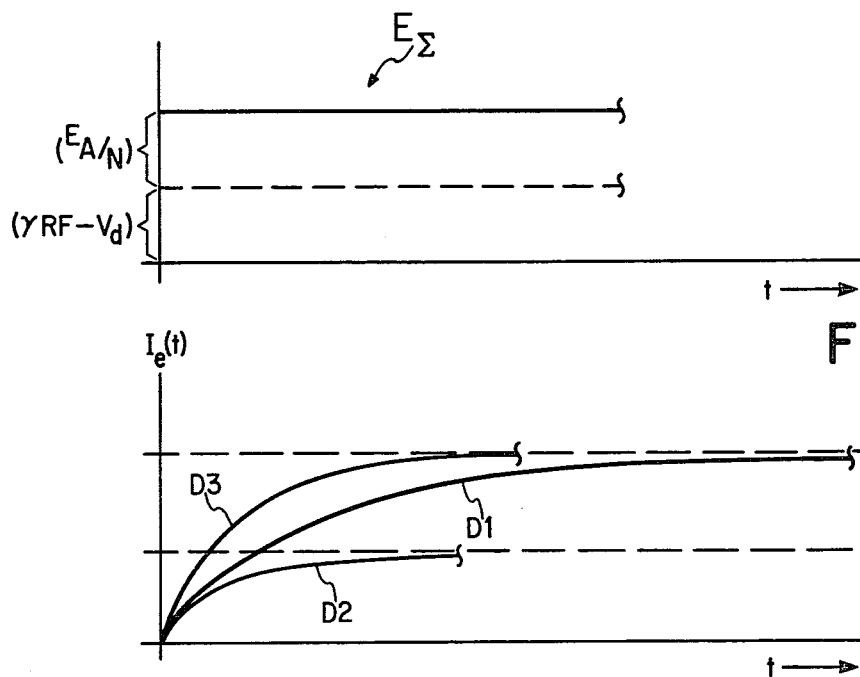
FIG. 6a
FIG. 6b

ENHANCEMENT OF CLASS C OPERATION OF BIPOLAR JUNCTION TRANSISTOR

This invention relates to electronics and to enhancing class C, RF operation of a BJT. BJT is used herein to mean bipolar junction transistor.

As is well known in the art, in the class C mode, the operating point is chosen so that the output current (or voltage) is zero for more than one-half of an input sinusoidal signal cycle.

In some applications, such as distance measuring navigation systems for aircraft, it is sometimes desirable to control or improve the shape or envelope of transmitted RF pulses. One incentive is to enable ranging circuits to more accurately locate the time slot of pulse occurrence. Another incentive is to control the emitted spectrum. Conventional BJT RF amplifiers, biased class C, can output rather poor envelope shapes in certain situations, especially during the turn-on or leading edge portion of the output.

In accordance with the present invention, there is provided means for enhancing and/or controlling the envelope of pulsed RF outputs of class C biased BJTs. These and other features, advantages, and objects of the present invention will become more apparent upon reference to the following specification, claims, and appended drawings in which:

Figure 3:
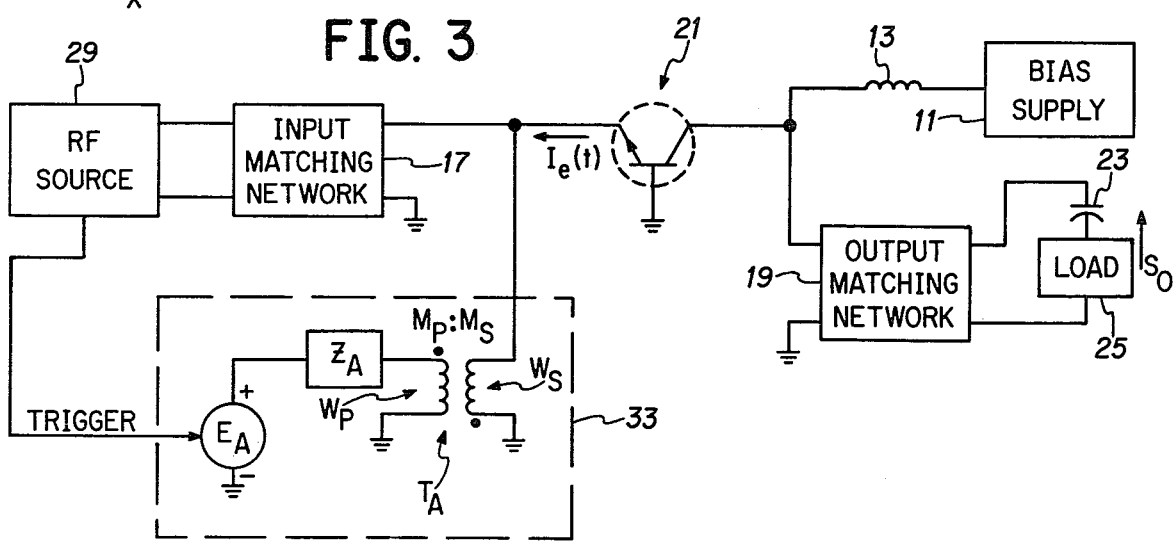
FIG. 3 is a circuit schematic representing the FIG. 1 amplifier as improved according to the presently preferred inventive embodiment.
Figure 4:
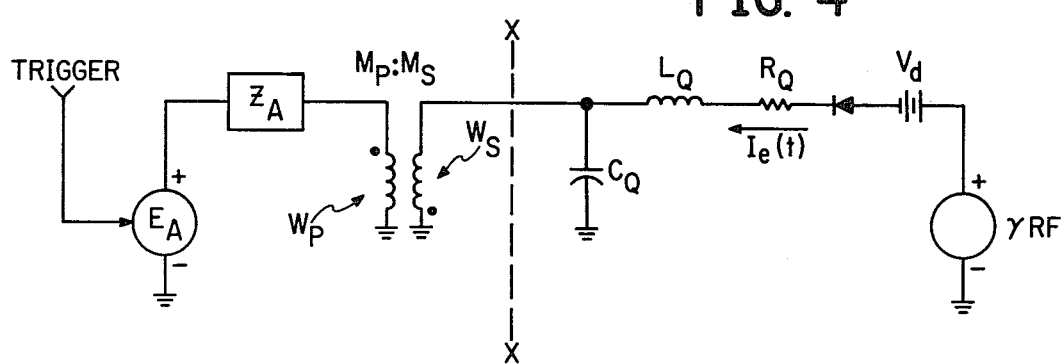
FIG. 4 is a circuit schematic representing an equivalent model of a part of the FIG. 3 apparatus.

FIGS. 5a and b, and 6a and b show waveforms useful in explaining operation of the FIGS. 3 and 4 apparatus.

Figure 1:
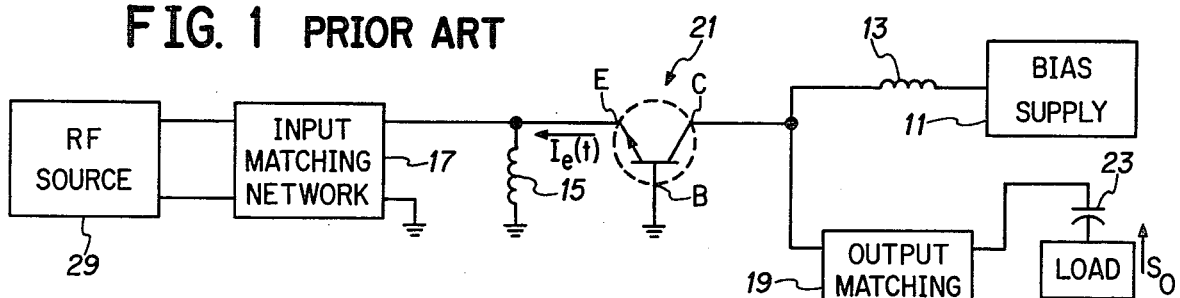
FIG. 1 is a block circuit schematic representing a prior art Class C BJT pulsed RF amplifier.

Referring now to FIG. 1, therein is shown a conventional BJT class C RF amplifier. For instance, the Rockwell-Collins 860E-4 DME driver is embodied as represented in FIG. 1. Bias supply 11 aids in establishing the class C mode. Collector bias choke 13 and emitter return inductor 15 provide RF impedance values sufficiently high to prevent excessive signal currents through their respective paths and to thereby prevent excessive signal power loss. Networks 17 and 19 match impedance levels into and out of BJT 21. Capacitor 23 is a blocking capacitor which eliminates DC in the output signal $S_o$ to the load 25. Load 25 is typically another driving or amplifying stage or an antenna. A typical BJT employed for BJT 21 is the MSC1075M, an NPN transistor having base, collector, and emitter electrodes. RF frequency is typically 1.0 to 1.1 GHz.

In operation, the RF source 29 typically outputs to the amplifier a train of RF bursts or pulses, each burst having an envelope or shape which is substantially rectangular. However, in the output pulse train, namely $S_o$, the pulse envelopes are degraded and less rectangular in shape than the pulse envelope from source 29. More specifically, $S_o$ pulse envelopes are typically slow to rise and often have some tilt during what should be the flat-top part of the pulse.

There are at least two sources of this problem of waveform degradation. One is associated with the L/R time constant in the BJT emitter circuit and the other is associated with the temperature dependency of BJTs.

Figure 2:
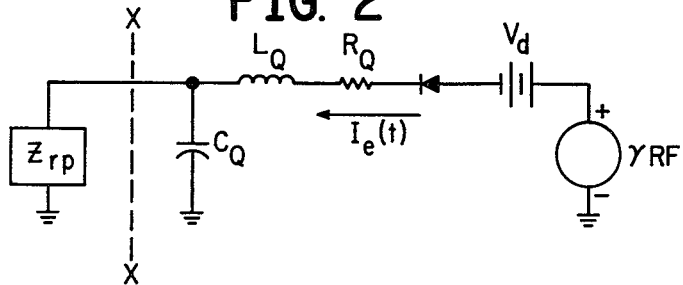
FIG. 2 is a circuit schematic representing an equivalent model of a part of the FIG. 1 apparatus.

To more fully explain, reference will now be made to FIG. 2 which shows a dc and transient model of the input to a typical NPN BJT microwave amplifier. To the right of dashed line X-X is shown an equivalent circuit representing the inside of the BJT. To the left of line X-X is the return path from emitter to ground, said return path including an impedance $Z_{rp}$ which is substantially the impedance of inductor 15. In FIG. 2, $V_d$ is the stand-off voltage of the base-to-emitter junction. The voltage source $\gamma RF$ is due to rectified power in the base-to-emitter junction and generally serves to provide an average dc current in the return circuit. In a common base circuit, this current is equal to all the device current. If the value of $\gamma RF$ is less than the value of $V_d$, no current will flow. (This is partly responsible for the threshold requirements of class C amplifiers.) For the case where the RF source 29 outputs rectangular bursts of RF, source $\gamma RF$ in the equivalent circuit model is assumed to output rectangular video-type pulses corresponding to the envelopes of the source 29 RF bursts.

$R_Q$ is the equivalent series resistance of the $\gamma RF$ source and is composed of several elements such as the inherent resistivity of the BJT part, bond wires, conductors, etc., as well as conductivity modulation effects due to current injection.

The transient turn on of the device is limited by the equivalent inductance $L_Q$ associated with the BJT device as well as the inductance $L_{rp}$ associated with the return path impedance $Z_{rp}$. Equivalent capacitance $C_Q$, also associated with the BJT device, is generally small enough with respect to $Z_{rp}$ that its effect is minimal. With $Z_{rp} = R_{rp} + j\omega L_{rp}$, then the L/R time constant for initial turn on is $\tau = (L_Q + L_{rp})/(R_Q + R_{rp})$.

For smaller $\tau$, and thus faster turn on, the total inductance (i.e. the numerator) should be decreased and/or the total resistance (i.e. the denominator) should be increased. However a circuit designer does not have much control over the device internal inductance $L_Q$ and resistance $R_Q$. Moreover, the value of $R_Q$, although typically large for a diode not well turned on, drops as the junction is flooded with carriers on the average. Also, increasing $R_{rp}$ minimizes the emitter current and thus limits the power capability of the device.

Moreover, the value of voltage of source $\gamma RF$ necessary to cause emitter current to be maximum is aggravated at cold temperatures. This is due to the stand off voltage $V_d$ increasing at cold temperatures, typically from 0.7 volts at room temperature to 1.0 volt or more at cold temperatures for silicon. In addition, $R_Q$ will increase for some areas of the semiconductor since the amount of thermally generated carriers is drastically reduced and, thus, conductivity is reduced.

As illustrated in FIG. 3, my preferred cure for these types of waveform degradation is to substitute a three element system 33 for the FIG. 1 choke 15. More particularly, the substitute system 33 comprises a transformer $T_A$, an impedance $Z_A$ and a pulse signal source $E_A$. Transformer $T_A$ has a secondary winding $W_S$, with $M_S$ turns, connected to occupy the terminals previously occupied by the choke 15. Transformer $T_A$ has a primary $W_p$, with $M_p$ turns, to which the impedance $Z_A$ and the pulse source $E_A$ are connected. The transformer primary to secondary turns ratio is $M_p:M_S = N$ where N is greater than one and is usually in the range of about 5 to 20. In applications for improving rise time of rectangular output pulses, impedance $Z_A$ is preferably nonreactive and source $E_A$ is preferably a source of rectangular video-type pulses synchronized with the RF pulses from source 29. In the preferred embodiment, $E_A$ is a voltage pulse source connected in series with $Z_A$, and the secondary $W_S$, as indicated by the dots in FIG. 3, is out of phase with the primary $W_p$.

For explaining the preferred solution in more detail, reference is made to FIG. 4 which shows to the right of line X-X the BJT equivalent circuit illustrated in FIG. 2 and which shows to the left of line X-X the three element system 33. As stated earlier, $C_Q$ is small enough that its effect is minimal. Referring $Z_A$ and $E_A$ to the secondary, emitter current $I_e(t)$ encounters in the resulting equivalent circuit not only the components $L_Q$, $R_Q$, $V_d$ and $\gamma RF$, but also an impedance $(Z_A/N^2)$ and an aiding voltage source $(E_A/N)$. The voltage source $(E_A/N)$ aids the $I_e(t)$ current because of the voltage polarity induced at secondary winding $W_S$ by source $E_A$. Such an equivalent circuit or model is a valid approximation assuming the secondary pulses are sustained for the duration of the primary pulses. This of course depends on $E_A$ pulse lengths being compatible with the transformer open circuit inductance value, the secondary being capable of sustaining longer $E_A$ pulses as the open circuit inductance value increases.

In general, $E_A$, $Z_A$, and N are selected such that the emitter current $I_e(t)$ in the FIG. 4 circuit is caused to approximate, or closely conform to, a desired pulse shape. By causing the emitter current to closely follow or conform to a desired shape, the collector current, which closely follows the emitter current, is also caused to closely conform to the desired pulse shape. Thus the output $S_o$ to the load is also caused to closely conform to the desired shape and pulse shape enhancement is thereby effected.

To illustrate more specifically the selection of $E_A$ and $Z_A$, the above-mentioned case, of reducing output pulse rise time in response to a rectangular RF burst input, is further pursued herebelow. For such case, as above indicated, the output of $\gamma RF$ in the BJT model is a rectangular pulse whose width corresponds to the rectangular RF burst width from source 29. The $\gamma RF$ pulse amplitude is a function of the amplitude of the RF burst from source 29. As earlier mentioned, the values of $L_Q$, $R_Q$, $C_Q$, and $V_d$ are functions of the internals of the transistor. Sufficient circuit flexibility and simplicity are offered by a rectangular $E_A$ pulse shape and a $Z_A$ with no reactance component. The amplitude and duration of the $E_A$ pulses, and the magnitude of the $Z_A$ resistive component $R_A$, are selected on the basis of the amplitude desired for $I_e(t)$ during the flat part of the pulse (i.e., the peak emitter current value) and on the desired rapidity of rise of $I_e(t)$ to this peak current amplitude.

During the flat part of the $I_e(t)$ pulse, the value of $I_e(t)$ is approximately $[(\gamma RF - V_d) + E_A/N]/[R_Q + (R_A/N^2)] = E_\Sigma/R_\Sigma$. The rising edge of the $I_e(t)$ pulse will increase according to an exponential curve, namely, $I_e(t) = (E_\Sigma/R_\Sigma)(1 - \epsilon^{-t/\tau_m})$, where $\tau_m = L_\Sigma/R_\Sigma$. Since the rise time to a fixed value can be reduced by increasing $E_\Sigma$ or increasing $R_\Sigma$, a sufficiently rapid rise in $I_e(t)$ to a desired peak value can often be obtained by selecting $R_A = 0$ (such that $R_\Sigma \approx R_Q$), and simultaneously selecting $E_A$ to be of a brief duration shorter than the $\gamma RF$ pulse such that $E_\Sigma$ initially steps to $[(\gamma RF - V_d) + (E_A/N)]$ and shortly thereafter steps down to $(\gamma RF - V_d)$. Such an $E_\Sigma$ waveform is illustrated in FIG. 5a and the $I_e(t)$ in response thereto is represented in FIG. 5b as solid curve C1. Note that curve C1, due to the extra impetus of $E_A/N$, initially follows dotted curve C2 toward a value $I_2$ but stops rising and flattens out at the desired peak value $I_1$ when $E_A$ falls. The width and amplitude of $E_A$ are selected such that $I_1$ is reached in the desired time. Note that the rise time of curve C1 is faster than the rise time of curve C3, curve C3 representing a typical emitter current with no $E_A$ pulse.

In some instances, it is found desirable to use a non-zero value for $R_A$. In such a case, the time constant $\tau_m$ is actually reduced, making the $I_e(t)$ rise more rapid, but the peak or flat-top value may be less than desired due to increased value of $R_\Sigma$. Thus, in such instances, $E_A$ pulses should be lengthened and maintained at a non-zero value for at least the duration of the $\gamma RF$ pulse. To exemplify, FIG. 6a represents $E_\Sigma = (\gamma RF - V_d) + E_A/N$ for an appropriately lengthened $E_A$ pulse. Curve D1 in FIG. 6b represents a typical $I_e(t)$ for $E_A$ and $R_A$ both equal to zero. Curve D2 in FIG. 6b illustrates $I_e(t)$ for the same situation as Curve D1 except $R_A \neq$ zero. Note the D2 rise time is faster than D1 but the peak is reduced. Curve D3 in FIG. 6b illustrates $I_e(t)$ for the same situation as Curve D2 except that now $E_A$ also $\neq$ zero. Note the faster time constant of D2 is maintained in D3 and the peak value is increased relative to D2.

My preferred solution to the earlier mentioned problem of temperature-variation-induced flat-top tilt is to use a temperature variable resistance, such as a sensistor, in $Z_A$. The temperature variation characteristic of such resistor is chosen to approximately complement the temperature variation characteristic of $R_Q$ and $V_d$ such that the emitter current $I_e(t)$ is made less dependent on temperature.

Various changes and modifications are of course within the scope of the present invention. For example, the principles hereinabove can be applied to achieve enhancement of RF output pulses whose envelopes are other than rectangular. Specifically, the principles herein have been employed to generate a highly efficient Gaussian or pseudo-Gaussian waveform. A three-element system like 33 is again used to cause emitter current $I_e(t)$ to follow a desired pulse shape, the difference relative to the rectangular case being that the desired pulse shape is pseudo-Gaussian. In accomplishing enhancement of the pseudo-Gaussian waveform, $Z_A$ is selected to be a capacitor in series with a diode and $E_A$ is selected to be either a rectangular or pseudo-Gaussian shaped pulse source. The diode portion of $Z_A$ prevents negative current spikes into the transistor emitter. Additionally, a resistor is put across the capacitor to discharge it. The value of the $Z_A$ capacitor $C_g$ is chosen to satisfy $\omega \approx [(1/L_\Sigma C_g) - (\frac{1}{4})(1/C_g^2 R_Q^2)]^{\frac{1}{2}}$ where $L_\Sigma$ is the total inductance encountered by the $E_A$ source current and is generally equal to $L_m$ where $L_m$ is the transformer magnetizing inductance; and where $\omega = 2\pi/T_H$ where $T_H$ is the desired width of the Gaussian pulse at half its amplitude. When the $E_A$ pulse is rectangular, its amplitude is selected such that it is less than or approximately equal to $R_Q$ times the peak of $I_e(t)$ and its width is selected such that it is approximately two times $T_H$. When the $E_A$ pulse is pseudo-Gaussian, its amplitude is selected such that it is approximately equal to $2R_Q$ times the peak value of $I_e(t)$ and its half-width is selected such that it is approximately equal to $T_H$.

It is further expected that trapezoidal waveforms may be enhanced by using the rectangular pulse time constant approach hereinabove not only on the leading edge but on the pulse trailing edge.

If not already apparent, it should here be pointed out that, in principle, the control of $I_e(t)$ could be accomplished without a transformer by using an $E_A$ and $Z_A$ of appropriate values directly in the emitter current path. However, the $Z_A$ impedance values which would be required would be extremely small. That is, since $R_Q$ is typically less than 0.1 ohm and $L_Q$ is typically on the order of one to two nanohenries, accomplishing the above goals without a transformer would require impedances typically in the range of about 0.1 ohm to a few tenths ohm. However, the stepdown transformer $T_A$ makes commonly available impedance values usable to accomplish the desired goal of enhancing pulse shape. Since $Z_A$ is reflected into the secondary as $Z_A/N^2$, an N between 5 and 20 makes most desired values of $Z_A/N^2$ easily obtainable.

Thus while particular embodiments of the present invention have been shown and/or described, it is apparent that changes and modifications may be made therein without departing from the invention in its broader aspects. The aim of the appended claims, therefore, it to cover all such changes and modifications as fall within the true spirit and scope of the invention.

What is claimed is:

1. A circuit comprising a class C biased BJT which is for outputting RF bursts, and means for controlling the shape of the envelope of said RF burst, said shape controlling means comprising:
   first means comprising a transformer having a primary winding with $M_p$ turns and a secondary winding with $M_S$ turns where $M_p:M_S > 1$, said secondary winding being connected in the BJT emitter current path,
   pulse source second means, connected to the primary winding, for providing pulses having predetermined parameters,
   impedance third means connected to the primary winding,
   said first, second, and third means cooperating to control the BJT emitter current and cause the BJT emitter current envelope to substantially conform to a predetermined function of time $I_e(t)$, where $I_e(t)$ is a pulse waveform.

2. Apparatus as defined in claim 1 wherein the polarity of the second means pulses, and the phase of the secondary winding, are appropriate to aid, rather than oppose, emitter current flow.

3. Apparatus as defined in claim 2 wherein the second means pulses are substantially rectangular in shape.

4. Apparatus as defined in claim 3 wherein the impedance third means has substantially no reactance component.

5. Apparatus as defined in claims 1, 2, or 3 wherein the impedance third means has substantially no reactance component and has substantially no resistance component.

6. Apparatus as defined in claims 1, 2, 3, or 4 wherein said impedance third means includes a temperature variable resistance for reducing emitter current dependency on temperature.

7. Apparatus as defined in claims 1 or 2 wherein (i) said third means comprises a capacitor and (ii) said second means pulses are substantially rectangular in shape.

8. Apparatus as defined in claims 1 or 2 wherein (i) said third means comprises a capacitor and (ii) said second means pulses are substantially pseudo-Gaussian in shape.

9. Apparatus as defined in claim 1, 2, or 3 wherein the pulse waveform $I_e(t)$ is substantially rectangular in shape.

10. Apparatus as defined in claims 1, 2, or 3 wherein the pulse waveform $I_e(t)$ is substantially pseudo-Gaussian in shape.

11. Apparatus comprising:
    a class C biased BJT for outputting RF bursts,
    a transformer having (i) a primary winding with a first number of turns and (ii) a secondary winding with a second number of turns, said first number being greater than said second number, and said secondary winding being connected in the BJT emitter current path,
    means for providing pulses having predetermined parameters, and being connected to said primary winding for delivering pulses thereto,
    whereby, said pulses cause the BJT emitter current envelope to substantially conform to a predetermined function of time where said predetermined function of time is a pulse waveform.

12. Apparatus as defined in claim 11 wherein said pulse providing means includes a resistance means for having a predetermined effect on the pulse parameters.

13. Apparatus as defined in claim 12 wherein said resistance means includes a temperature variable resistance for reducing emitter current dependency on temperature.

14. Apparatus as defined in claim 11 wherein said pulse providing means includes a capacitance means for having a predetermined effect on said pulse parameters.

15. Apparatus as defined in claims 11, 12, 13, or 14 wherein the pulse providing means pulses have a shape which is a predetermined one of substantially rectangular or substantially pseudo-Gaussian.

* * * * *